(12) United States Patent
Eneboe et al.

(10) Patent No.: US 6,792,584 B1
(45) Date of Patent: Sep. 14, 2004

(54) SYSTEM AND METHOD FOR DESIGNING AN INTEGRATED CIRCUIT

(75) Inventors: Michael Eneboe, San Jose, CA (US); Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 214 days.

(21) Appl. No.: 10/021,619

(22) Filed: Oct. 30, 2001

(51) Int. Cl.[7] .......................... G06F 17/50; G06F 9/45; G06F 19/00
(52) U.S. Cl. ................... 716/8; 716/18; 716/1; 716/17; 716/2; 716/7
(58) Field of Search .................... 716/8, 18, 1, 17, 716/2, 7

(56) References Cited

U.S. PATENT DOCUMENTS

| | | | |
|---|---|---|---|
| 4,656,592 A | | 4/1987 | Spaanenburg et al. |
| 5,220,512 A | * | 6/1993 | Watkins et al. ............... 716/11 |
| 5,224,055 A | * | 6/1993 | Grundy et al. ................ 716/11 |
| 5,303,161 A | * | 4/1994 | Burns et al. .................... 716/9 |
| 5,452,231 A | * | 9/1995 | Butts et al. .................... 716/17 |
| 5,544,067 A | * | 8/1996 | Rostoker et al. ............. 703/14 |
| 5,752,070 A | | 5/1998 | Martin et al. .......... 395/800.33 |
| 5,818,728 A | | 10/1998 | Yoeli et al. |
| 5,818,729 A | | 10/1998 | Wang et al. |
| 5,898,677 A | | 4/1999 | Deeley et al. ............. 370/276 |
| 6,134,516 A | * | 10/2000 | Wang et al. .................. 703/27 |
| 6,152,613 A | | 11/2000 | Martin et al. .......... 395/800.33 |
| 6,216,259 B1 | * | 4/2001 | Guccione et al. ............. 716/17 |
| 6,269,277 B1 | | 7/2001 | Hershenson et al. |
| 6,366,874 B1 | * | 4/2002 | Lee et al. ...................... 703/14 |
| 6,421,251 B1 | * | 7/2002 | Lin ............................. 361/788 |
| 6,459,136 B1 | | 10/2002 | Amarilio et al. |
| 6,470,482 B1 | * | 10/2002 | Rostoker et al. ............... 716/6 |
| 6,539,531 B2 | * | 3/2003 | Miller et al. .................. 716/15 |
| 6,546,536 B1 | * | 4/2003 | Nolan .......................... 716/11 |
| 6,654,946 B1 | * | 11/2003 | Eneboe et al. ................ 716/18 |

FOREIGN PATENT DOCUMENTS

| JP | 01202397 | 7/2001 |
|---|---|---|
| JP | 02202886 | 7/2002 |

OTHER PUBLICATIONS

Karim et al., On–Chip Communication Architecture for OC–768 Network Processors, Proceedings of the 38th Conference on Design Automation, pp. 678–683, Jun. 2001.*
Alan Singletary, Techniques for Enabing FPGA Emulation of IBM CoreConnect Designs. [online]. IBM Corporation, 2000. [retrieved on Jul. 25, 2003]. Retrieved from the Internet: <http:www.ibm.com/chips/micronews/vol6_no2/singletary>.*
"On–chip Networks weighted as wiring alternative," by Ron Wilson, Integrated System Design, Jun. 25, 2001; http://www.eet.com/story/OEG20010625S0099, Jul. 3, 2001.
"Configurable Computing," by John Villasenor and William H. Mangione–Smith; Scientific American, Jun. 1997, http://www.sciam.com/0697issue/0697villasenor.html, Aug. 7, 2001.
"Self–Reconfigurable Programmable Logic Device", Reetinder Sidhu, et al., University of Southern California, Office of Technology Licensing, Lose Angeles, CA, Sep. 7, 2001. Self–Reconfigurable Programmable Logic Device—Author(s)—Sidhu et al.

* cited by examiner

Primary Examiner—A. M. Thompson
(74) Attorney, Agent, or Firm—Suiter West PC LLO

(57) ABSTRACT

The present invention provides a comprehensive design environment defining a system architecture and methodology that may integrate interconnects, cores, ePLC, re-configurable processors and software into a manageable and predictable system designs that achieve on-time system IC design results meeting desired specifications and budgets. For example, an interscalable interconnect maybe provided that is scalable and isochronous capable. Additionally, an abstract language may be provided to be able to describe interconnecting core functions. Further, a self-programmable chip may be provided that, upon receiving a construct, it could program itself to achieve the desired functionality, such as through the use of on-chip knowledge and the like.

19 Claims, 13 Drawing Sheets

SYSTEM AND METHOD FOR DESIGNING AN INTEGRATED CIRCUIT

CROSS REFERENCE TO RELATED APPLICATIONS

The present application hereby incorporates the following United States patent applications by reference in their entirety:

| Ser. No. | Filing Date |
| --- | --- |
| 10/021,414 | Oct. 30, 2001 |
| 10/021,696 | Oct. 30, 2001 |

FIELD OF THE INVENTION

The present invention generally relates to the field of integrated circuit design, and particularly to a system and method for designing an integrated circuit.

BACKGROUND OF THE INVENTION

Integrated circuits (IC) have become one of the most necessary components in modern devices. From automobiles and cell phones, to kitchen appliances and video gaming devices, integrated circuits provide a variety of functions. To provide this variety in an optimized manner, application specific integrated circuits (ASIC) may be utilized.

An application specific integrated circuit is generally designed for a specific application rather than as a general-purpose chip. The use of application specific integrated circuits improve performance over general-purpose chips, because application specific integrated circuits are "hard-wired" to do a specific job, and may thus, not incur the overhead of fetching and interpreting stored instructions. Thus, an application specific integrated circuit may perform an electronic operation in an optimized manner providing that the circuit design is efficiently architected.

However, producing such a wide range of application specific integrated circuits, each having targeted functionality, may be complex, expensive and time consuming. For example, the very size of the circuit, which may include a variety of clock domains, may require extensive testing, verification and redesign before an operational model is produced.

Therefore, it would be desirable to provide a system and method for designing an integrated circuit.

SUMMARY OF THE INVENTION

Accordingly, the present invention is directed to a system and method for designing an integrated circuit. The present invention provides a comprehensive design environment defining a system architecture and methodology that may integrate interconnects, cores, ePLC, re-configurable processors and software into a manageable and predictable system designs that achieve on-time system IC design results meeting desired specifications and budgets. For example, the present invention may provide a scalable, temporal interconnect-fabric with standardized core interfaces, and implement a methodology to integrate configurable processors and solution software to design an integrated circuit.

In a first aspect of the present invention, a method for designing an integrated circuit includes manipulating representations of components of an integrated circuit on a display device by a user. An interconnect is specified having a characteristic between a first represented component and a second represented component. Data, suitable for describing the specified interconnect between the first represented component and the second represented component, is extracted.

In a second aspect of the present invention, a system for designing an integrated circuit includes a display device, a memory and a processor. The display device is suitable for displaying representations of components of an integrated circuit for manipulation by a user. The memory is suitable for storing a program of instructions and the processor is suitable for performing a program of instructions. The processor is communicatively coupled to the display device and the memory. The program of instructions configures the processor to display representations of components of an integrated circuit for manipulation by a user on the display device so that a user may specify an interconnect having a characteristic between a first component representation and a second component representation, and extract data describing the first represented component, the second represented component and the specified interconnect as manipulated by the user.

In a third aspect of the present invention, a system for designing an integrated circuit includes a display device, a memory, a processor and an integrated circuit. The display device is suitable for displaying representations of components of an integrated circuit for manipulation by a user. The memory is suitable for storing a program of instructions and the processor is suitable for performing a program of instructions. The processor is communicatively coupled to the display device and the memory. The program of instructions configures the processor to display representations of components of an integrated circuit for manipulation by a user on the display device so that a user may specify an interconnect having a characteristic between a first component representation and a second component representation, and extract data describing the first represented component, the second represented component and the specified interconnect as manipulated by the user. The integrated circuit is communicatively coupled to the processor, wherein the integrated circuit receives the extracted data. The extracted data is utilized by the integrated circuit for being programmed to include the interconnect having the characteristic between a first component corresponding to the first component representation and a second component corresponding to the second component representation.

In a fourth aspect of the present invention, an application specific integrated circuit includes a first component and a second component suitable for providing integrated circuit functions. The first component is communicatively coupled to a first interface device and the second component is communicatively coupled to a second interface device. An interconnect, suitable for communicatively coupling the first interface device with the second interface device, enables communication of the first component with the second component. A memory suitable for storing a program of instructions is also included, the program of instructions including data received for configuring an interconnect having a characteristic between components of an application specific integrated circuit. Further, a processor is included suitable for performing the program of instructions, the processor communicatively coupled to the memory. The program of instructions configures the processor to configure the first component, the second component, and the interconnect to correspond to an interconnect having the characteristic as indicated by the program of instructions It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1A:
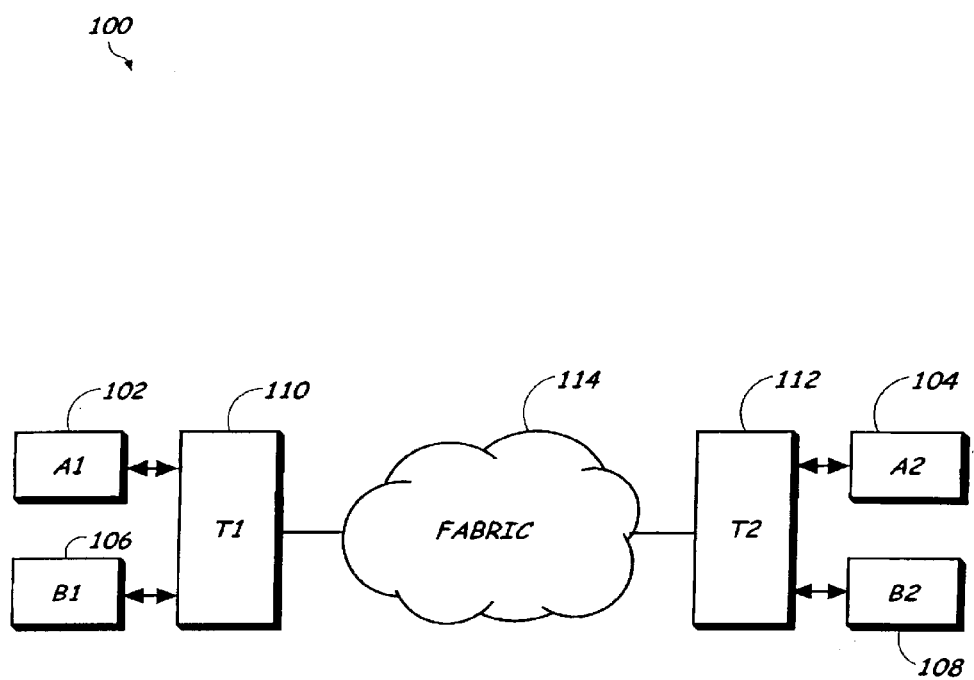
FIG. 1A is an illustration of an embodiment of the present invention in which an interconnect is provided for I/O within an ASIC.

Reference will now be made in detail to the presently preferred embodiments of the invention, examples of which are illustrated in the accompanying drawings.

Referring generally now to FIGS. 1A through 11, exemplary embodiments of the present invention are shown. An application specific integrated circuit (ASIC) is generally designed for a specific application rather than as a general-purpose chip. The use of application specific integrated circuits improve performance over general-purpose chips, because application specific integrated circuits are "hard-wired" to do a specific job, and may thus not incur the overhead of fetching and interpreting stored instructions. However, the design of application specific integrated circuits may encounter further complications over general circuit design.

There are many varieties of ASIC manufacturing, such as custom built circuits from scratch, which is time consuming and complicated, to using gate arrays, standard cells, programmable logic devices (PLD), customer specific integrated circuits (CSIC), application specified standard products (ASSP), and the like. However, as the number of gates increase, such as gate counts over 50 million, the lack of a comprehensive connectivity that embraces the disparate IP, numerous clock domains, exponential growth of on-chip bandwidth, problems of functional verification as the complexity and number of functional elements grow, and the like, make such a design process exceedingly difficult. Further, current design procedures are implemented without a re-use methodology, thereby limiting current implementations from improving future design implementations.

Additionally, the variety of implementations encountered may each, in and of itself, encounter different problems. For instance, in home networks, diverse cores and software may be required; in general networking, data switching and routing must be dealt with; in set-top boxes, streaming data, software and cores to provide the streaming data are needed; whereas in communications, data streams, power and programmability are issues which need to be addressed. Moreover, in data storage, performance, throughput and persistent of storage are concerns, and in appliances, real-time operating systems, power, and time to market are concerns. Therefore, a manufacturer must address time-to-market, IP, software, performance, power, cost, and the like in the production of an application specific integrated circuit.

Further, the utilization of temporal data brings about new challenges. For example, MPEG, AVI, MP3, QuickTime, voice data, cell phones, voice-over-Internet protocols, and the like must be provided with sufficient data in a usable order in order to provide the content to a user. For instance, business and financial "tickers," auctions, and the like require timely delivery of data Moreover, storage area networks (SAN) and NAS require reliable data transfer to ensure data integrity. Since the data is temporal, every shared data type has a "time value," and quality of service (QoS) is vital to ensure the time value.

Therefore, the present invention provide a comprehensive design environment defining a system architecture and methodology that may integrate interconnects, cores, ePLC, re-configurable processors and software into a manageable and predictable system designs that achieve on-time system IC design results meeting desired specifications and budgets. For example, the present invention may provide a scalable, temporal interconnect-fabric with standardized core interfaces, and implement a methodology to integrate configurable processors and solution software to design an integrated circuit.

Referring now to FIG. 1A, an embodiment of the present invention is shown wherein an interconnect is provided for I/O within an ASIC. A plurality of devices, such as A1 102, A2 104, B1 106 and B2 108 are included within a single ASIC 100. A first interface device 110 and a second interface device 112 are provided to enable communications between the devices 102, 104, 106 & 108. The first interface device 110 and the second interface device 112 interface through a type of virtual connection configured as a "cloud" and/or "network" of interscalable, isochronous interconnect glue logic 114 within the ASIC 100.

Preferable, the first interface device 110 and the second interface device 112 are invisible to the devices 102, 104, 106 & 108 to provide a virtual connection implemented as a serial differential signaling serial protocol, but which may be configured to mimic functionality of traditional I/O interfaces and/or protocols, at a variety of layers of a reference model, such as a TCP/IP reference model and the like. The present invention may be implemented as a circuit, such as a programmable logic device (PLD) which may be programmed by a customer at the customer's site, FPGA, simple programmable logic device (SPLD) which includes an array of programmable logic blocks, complex programmable logic device (CPLD) which may include a programmable logic device that includes a programmable interconnect between the logic blocks, and the like as contemplated by a person of ordinary skill in the art without departing from the spirit and scope of the present invention.

Figure 1B:
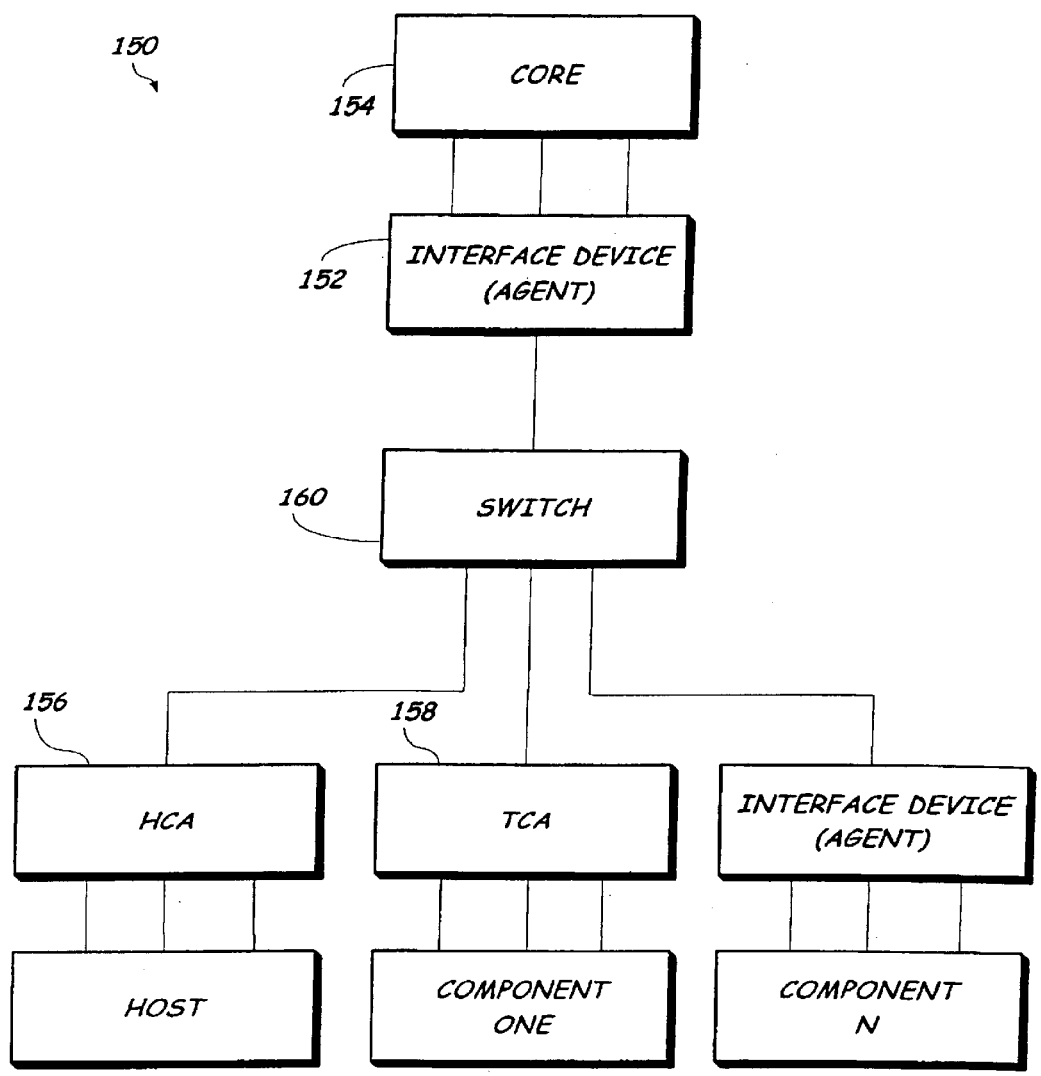
FIG. 1B is a block diagram of an embodiment of the present invention wherein a fabric interconnect is shown.

Referring now to FIG. 1B, an embodiment 150 of the present invention is shown wherein a fabric interconnect is operable to embody the present invention. An interface device 152, such as a channel adapter, may provide connectivity from a core 154 to a fabric interconnect of an ASIC designed in accordance with the present invention.

A fabric interconnect may utilize messages, which in this instance are defined as a logical unit of work, to execute transactions. For example, message semantics may support memory operations such as remote direct memory access (RDMA) reads, writes, and channel operations such as send, receive, and the like.

Messages may be further segmented into packets. Data packets are an end-to-end fabric unit of transfer, e.g. packets are the routable unit of transfer. Hardware of the present invention may provide automatic message segmentation and re-assembly via packets. Packets include headers to identify the packet destination and the desired data. For example, packets may include a local route header (LRH), global route header (GRH), base transport header (BTH), extended transport header (ExTH), intermediate data, a message payload, an invariant CRC, a variant CRC, and the like.

An interface device may be provided as a bridging section from a block interface to system interconnects. Interface devices may include elasticity buffers, support isochronous timing capabilities, interrupt message, memory DMA and unified memory addressing, and the like as contemplated by a person of ordinary skill in the art.

For example, an interface device may be configured as a host channel adapter (HCA) 156. A host channel adapter 156 is generally a host concept configured for computing platforms. For example, a HCA may be configured for high-end devices, such as nodes, memory array controllers, and the like. Functions of a HCA may include implementation of a link protocol in hardware, implement software verbs, as a RDMA engine, work queue engine, memory registration and protection, and the like as contemplated by a person of ordinary skill in the art. Thus, the HCA 156 may act to implement high-end devices in the architecture of the present invention. However, there may be implementations where the full level of functionality of an HCA is not desired, such as specialized subsystems.

An interface device may also be configured as a target channel adapter (TCA) 158 for specialized subsystems. TCA 158 may be configured as simpler than HCA 156 so that it implements what is required to minimally support fabric architecture and device-specific functionality. For example, a TCA may be configured as a work queue engine, a link protocol engine, implement transport, and the like. It should be apparent to a person of ordinary skill in the art that an interface device may be configured in a variety of ways without departing from the spirit and scope of the present invention.

To ensure packet delivery within a fabric interconnect, a switch 160 may be provided. For instance, the switch may operate as a packet-switching element within a fabric subnet. Packets may be switched, for example, based on a local identifier (LID) within a local route header (LRH) as described previously. A router, which may be though of as a superset of a switch, may also be provided to enable packet routing between systems.

Isochronous communications provide a time reference, but not in the sense of a system clock. Phase and frequency may be locked to a time reference of data streams passing through a chip. In other words, in an isochronous implementation, it is the beginning and end of a transmission of data that is determined. Thus, the time reference is abstract, and exists outside, the clock.

Further, an envelope time frame model may be employed, in which only endpoints count, and what happens between endpoints of a time frame is irrelevant to the actual passing of the data. Such an implementation may be particularly useful in internal processes within a chip, since time is not always of the essence, but it may be in scheduling. Moreover, isochronous communication allows hierarchical design, because timing closure for each pair-wise communicating block may be closed separately from the rest of an ASIC, which may be thought of as a form of asynchronous but synchronous design.

In an aspect of the present invention, isochronous communication is packet based, scalable, memory based, may act as a smart switch/router, allows closed timing within their own time domain (i.e. allows hierarchical design), allows for byte alignment, and the like. Further, handshaking may be performed to establish a connection.

Figure 1C:
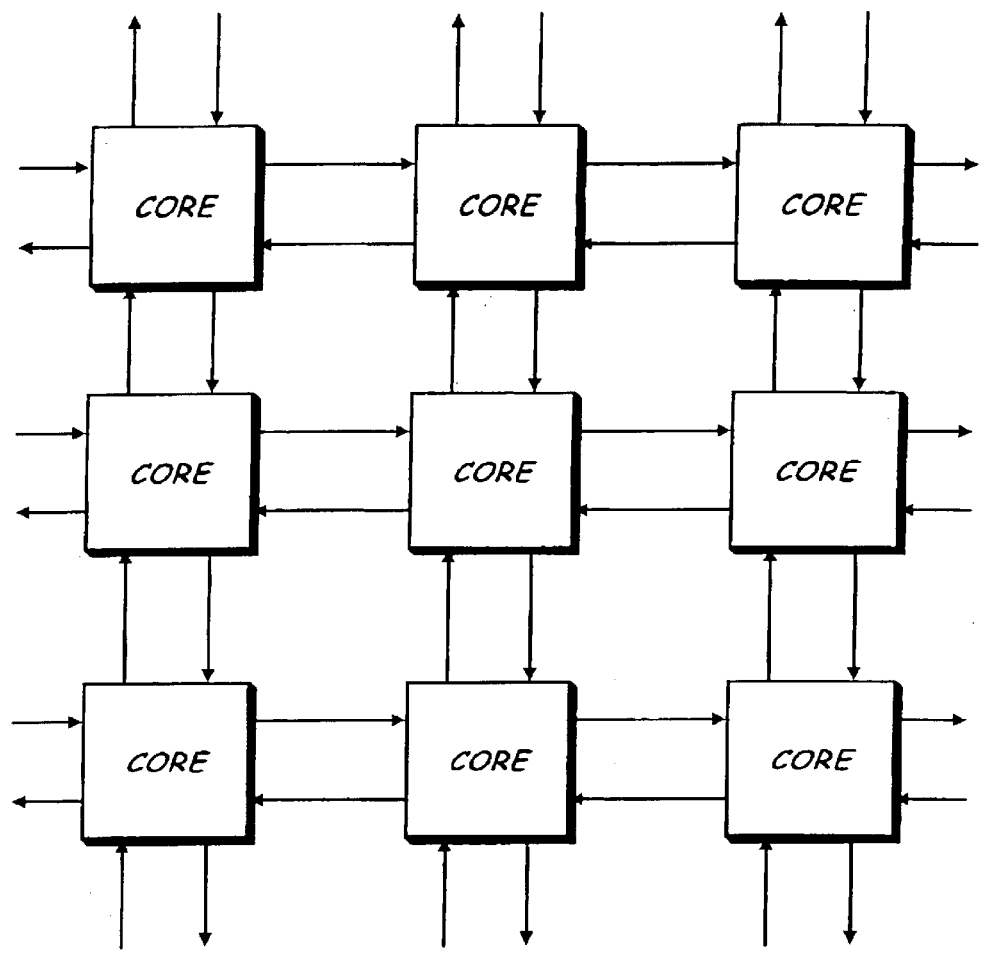
FIG. 1C is a block diagram of an embodiment of the present invention wherein a distributed multi-dimensional MESH architecture is shown.

Further, an interconnect architecture may be employed utilizing a variety of configurations. For example, as shown in FIG. 1B, a centralized crossbar, or packet switch may be utilized for data transfer. Additionally, a distributed multi-dimensional MESH architecture may be employed, an example of which is shown in FIG. 1C. Block interfaces may be standardized, such as by utilizing advanced microcontroller bus architecture (AMBA), on-chip-bus (OCB), and the like, as well as support full duplex operations, and the like, and may be specified with a protocol language.

Figure 2:
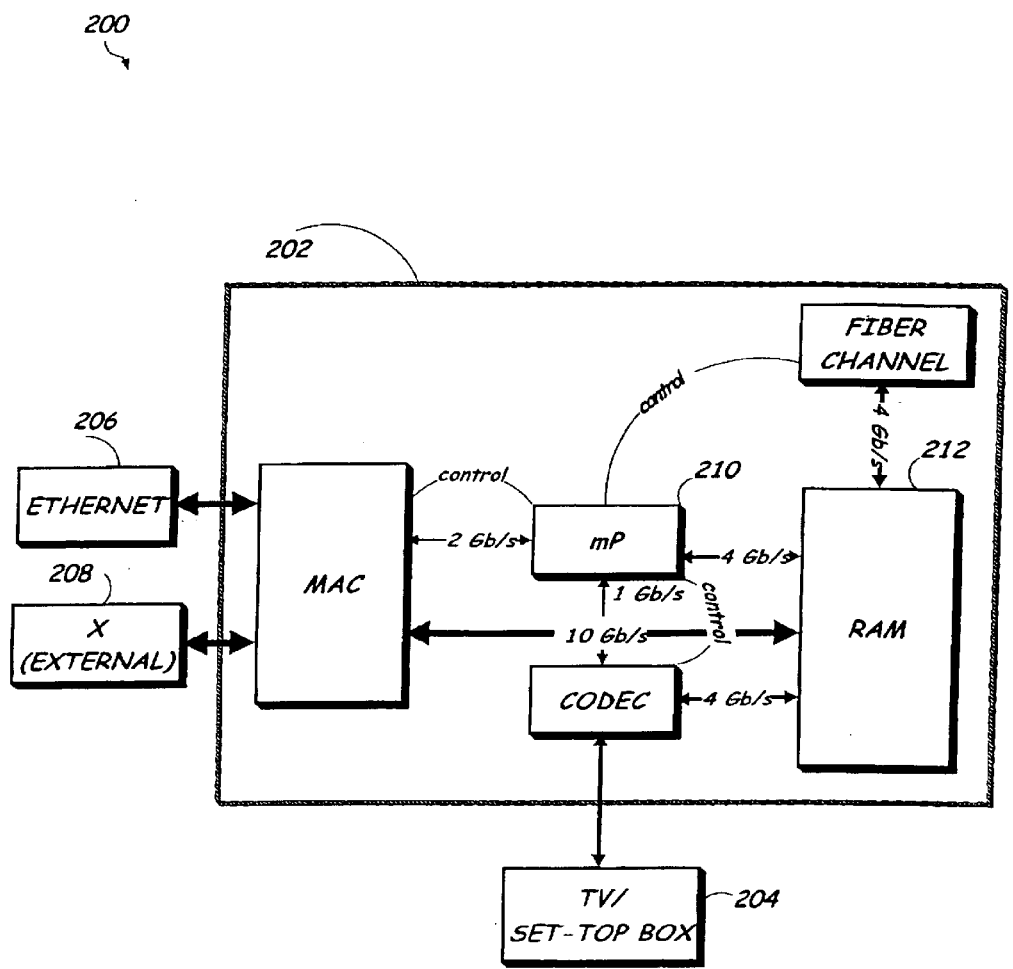
FIG. 2 is an illustration of an embodiment of the present invention wherein a single application specific integrated circuit (ASIC) with configured bandwidth between components is shown.

Referring now to FIG. 2, an embodiment 200 of the present invention is shown wherein a single application specific integrated circuit (ASIC) with configured bandwidth between components is employed. An ASIC 202 may be configured for a variety of tasks, such as providing functionality to a TV/Set-top box 204, Ethernet 206, and other external device 208 as contemplated by a person of ordinary skill in the art. The ASIC may include a variety of components, such as a microprocessor 210, RAM 212, and the like, which communicate at different target bandwidths.

By utilizing the present invention, a "wrapper-on-chip bus" (OCB) may be provided around the components to take advantage of and optimally configure bandwidth within the ASIC. For example, bandwidth may be configured when the ASIC components, such as cells, blocks and cores, are built or instantiated within the ASIC, may be configured "on-the-fly" in a FPGA or PLD fashion, and the like as contemplated by a person of ordinary skill in the art. In the illustration shown in FIG. 2, bandwidths are shown with varying degrees of lines with arrows, and control lines, such as for in-band signaling for control instructions both to and from the microprocessor 210 core, are shown with lines without arrowheads.

In this way, the present invention may provide a system and software to create a routing scheme for an ASIC, which may then be utilized in fabrication. For example, a GDSII netlist may be provided for fabrication which may include a "hard" macro, i.e. macro cell, which may include a design of a logic function for specifying how required logic elements are interconnected and specifies the physical pathways and wiring patterns between components, as opposed to a "soft" macro, which may a design of a logic function that specifies how the required logic elements are interconnected, but not the physical wiring pattern on the chip.

Further, the scheme may provide scalability, such as speed per link, number of links, and the like. For example, to address clock considerations, such as a lower clock speed, 20 links may be provided to achieve the desired bandwidth, for power considerations, a higher clock speed and fewer connections may be utilized.

Figure 3:
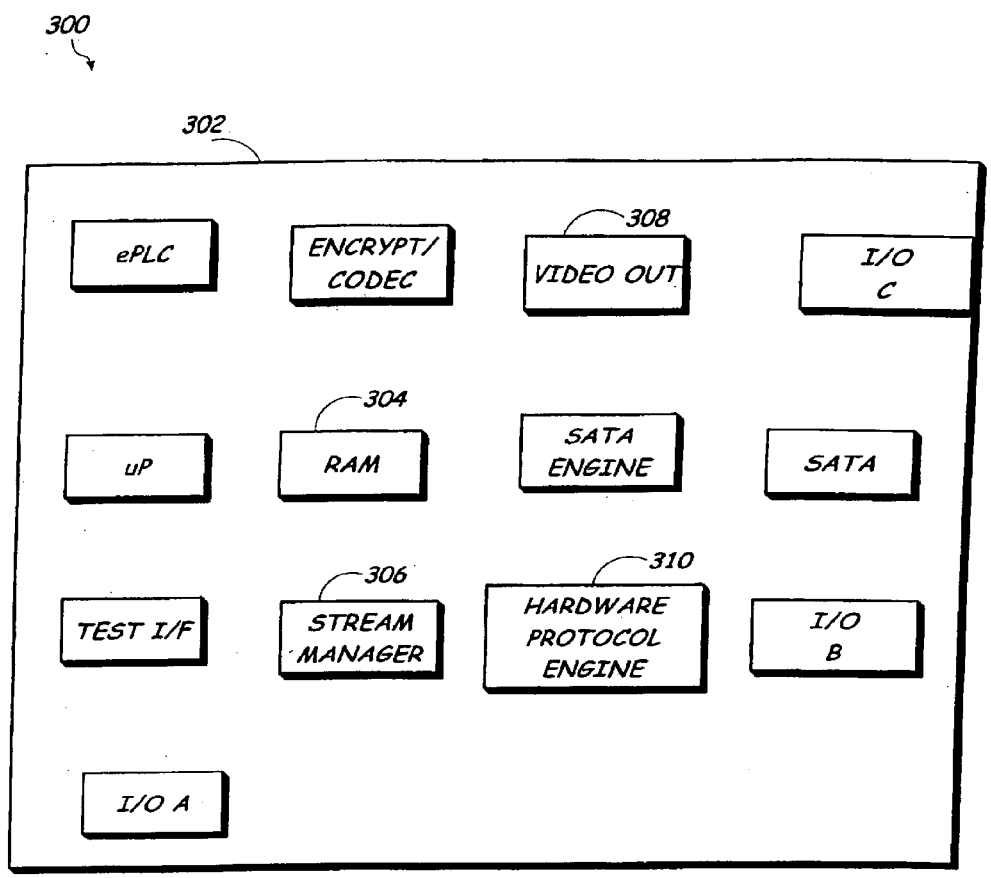
FIG. 3 is an illustration of an aspect of the present invention in which an interface is provided suitable for designing an application specific integrated circuit.

Referring now to FIG. 3, an embodiment of the present invention is shown wherein an interface is provided suitable for designing an application specific integrated circuit. A display, suitable for being output on a display device of an information handling system, is shown. The display includes a canvas 302 including a plurality of drag and drop cores and functional blocks. For example, RAM 304, stream manager 306, video out 308, hardware protocol engine 310, and the like are shown as block representations on the canvas 302. The representations may be selected from a listing of representations in a database, template, and the like. Thus, a user may select the desired components of an ASIC in a user-friendly manner. For example, a "drag-and-drop" interface for supplying cores, hierarchal modules and technologies may be implemented.

Figure 4:
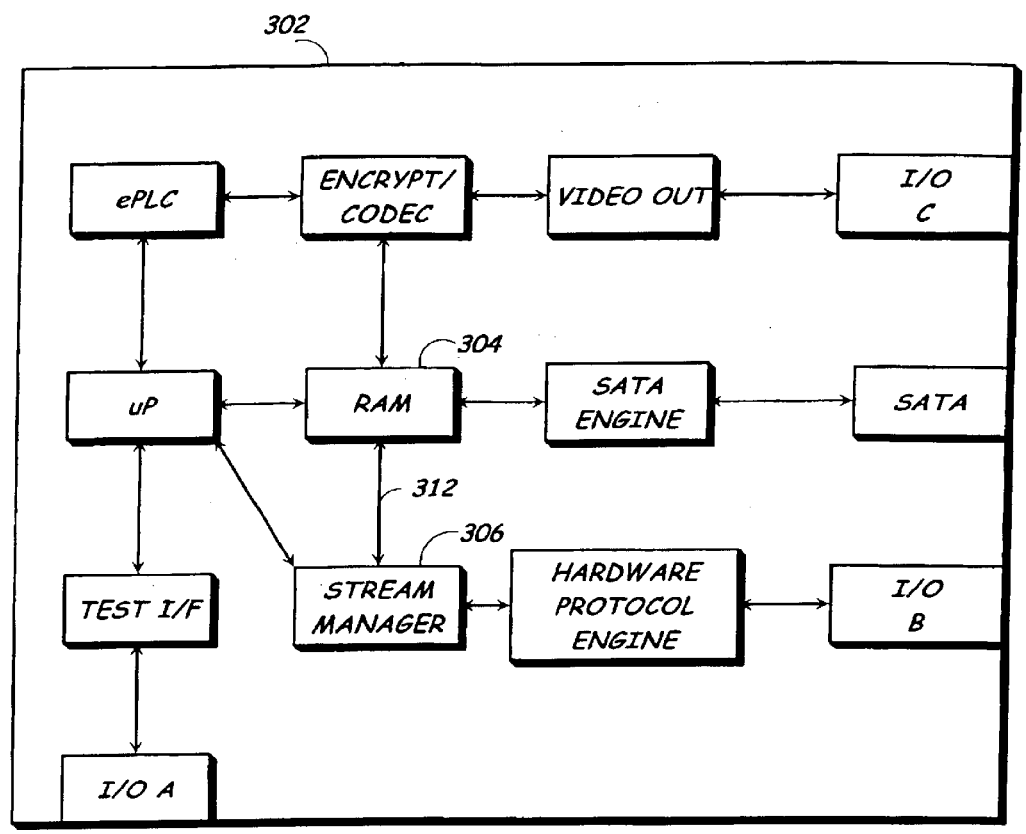
FIG. 4 is an illustration of the embodiment of the present invention depicted in FIG. 3 wherein connectivity is indicated between components by a user.

Next, connectivity may be indicated between components, as shown in the embodiment depicted in FIG. 4. Connections, indicated with the use of arrows, may be utilized to indicate interconnects between components. For example, an arrow 312 may be used to indicate an interconnection between a RAM functional block 304 and a stream manager function block 306. Additional interconnects may also be specified by a user until all the desired connections have been established.

Figure 5:
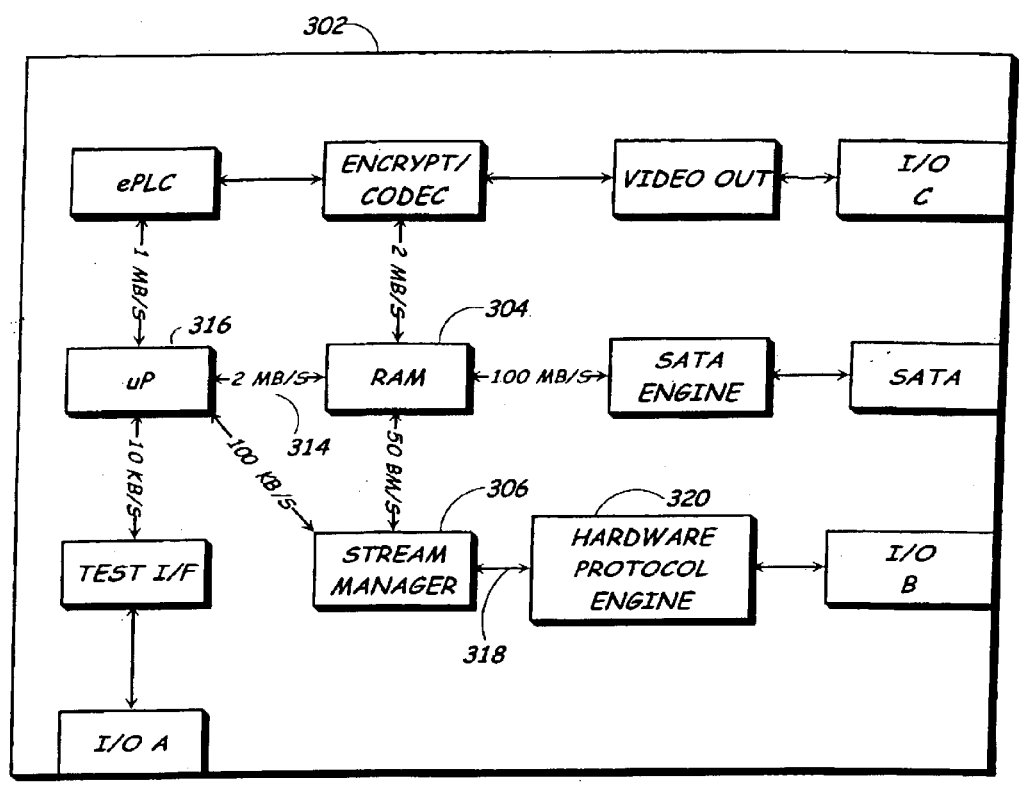
FIG. 5 is an illustration of the embodiment of the present invention depicted in FIG. 4 wherein interconnect performance and other functionality is described.
Figure 6:
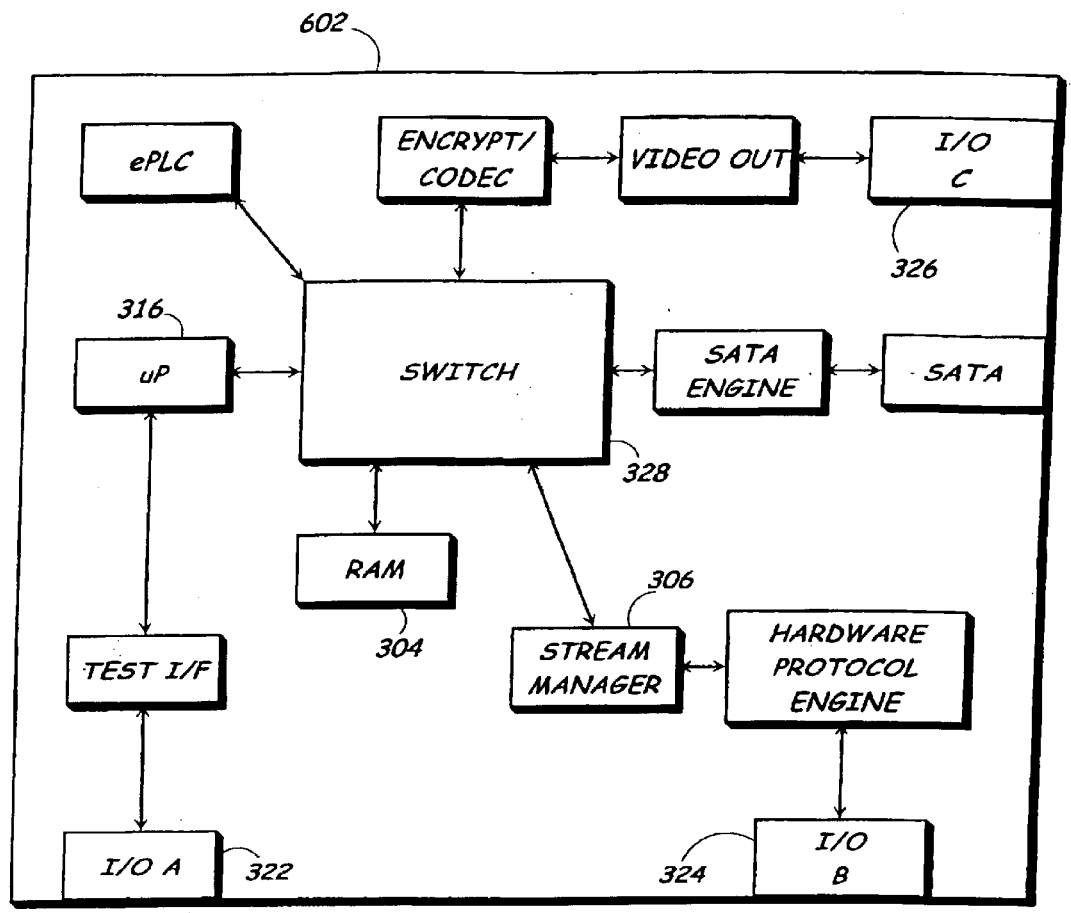
FIG. 6 is an illustration of an embodiment of the present invention wherein by utilizing a direct connectivity definition, software arranges and optimizes interconnects to provide an optimized ASIC.
Figure 7:
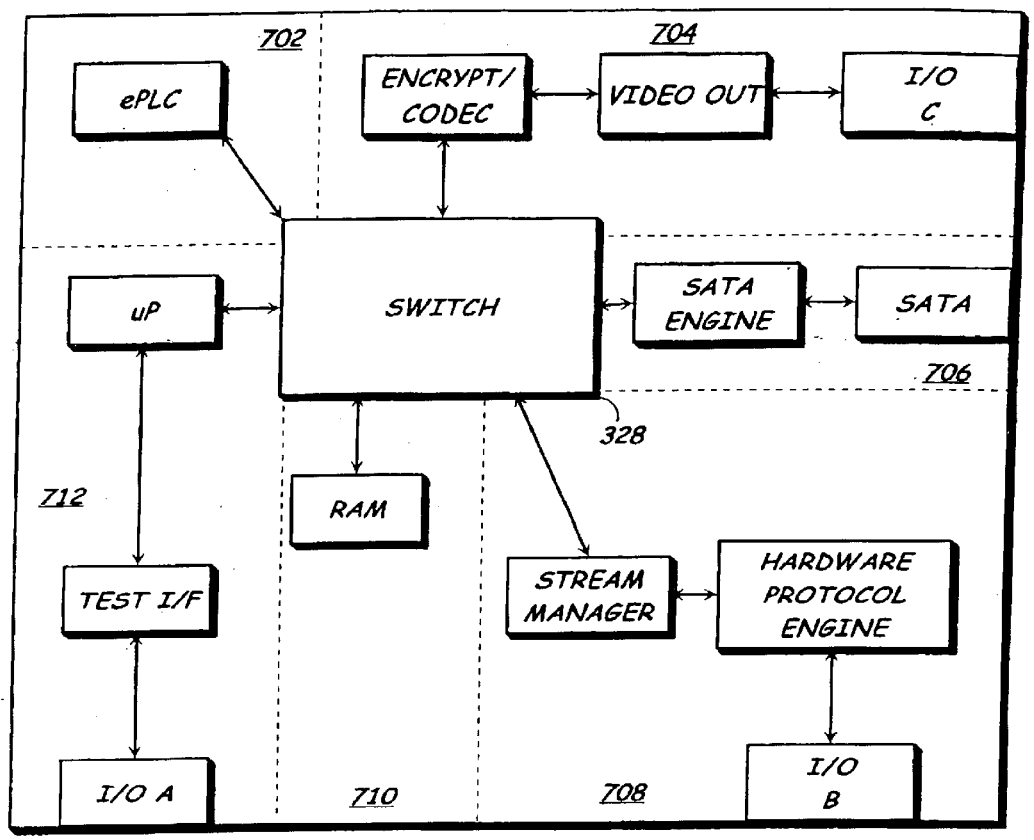
FIG. 7 is a depiction of an embodiment of the present invention wherein an agent may determine that switched modularity may be beneficially employed and implements such modularity in an ASIC.

Then, interconnect performance and other functionality may be described, as shown in the embodiment depicted in FIG. 5. In this example, bandwidth is specified for the interconnections indicated in FIG. 4. For instance, a bandwidth of 2 MB/s may be defined for an interconnect 314 between a processor 316 and RAM 304 by a user, such as by selecting the interconnect 314 and accessing a menu, an input box, and the like. Likewise, the user may continue to specify interconnect performance between other components, such as RAM 304 and the stream manager 306, and the like. It may also be desirable to provide a default for performance between unspecified interconnects, such as an interconnect 318 provided between the stream manager 306 and a hardware protocol engine 320. In this way, a direct connectivity definition for functional components of an ASIC may be achieved. It may also be preferable to enable such undefined interconnects to be configured automatically, as will be discussed later.

By utilizing the direct connectivity definition, software may arrange and optimize interconnects to provide an optimized ASIC. For example, as shown in the embodiment depicted in FIG. 6, an ASIC design 602 is derived from the direct interconnectivity definition and functional components as specified by a user as shown in FIGS. 4 & 5. Input/output components 322, 324 & 326 are arranged toward the outer portions of the canvas 602. A switch 328 is provided to enable transfer of data packets between the components, such as a fabric interconnect as described previously. Thus, RAM 304, stream manager 305, processor 316, and like components may be interconnected.

Further, the position of the components, as well as the interconnections between components, may be configured to provide the desired bandwidth as specified by the direct connectivity definition, as well as provide desired latency. Moreover, logic, such as implemented through an agent, may be employed to arrange components so that necessary interconnections are provided, interconnections arranged to minimize interference, and the like as contemplated by a person of ordinary skill in the art.

Logic, which may be implemented as an agent, may also be employed to provide a variety of arrangements based on the included components and interconnections. For example, an agent may determine that switched modularity may be beneficially employed, as shown in the embodiment 700 depicted in FIG. 7, so that logical components utilizing the switch 328 may each be arranged as switched modular groups 702,704,706,708, 710 & 712.

Isochronous communication may be utilized for internal processes within a chip, and provides hierarchical design, since timing closure for each pairwise communicating block may be closed separately from other components of the ASIC, and the like. The interconnect may be memory-bus based, and not "channel" based in contemplated embodiments to provide flexibility. Further, interconnects may be switch-capable, utilizing packet-based addressing routes as previously described.

Figure 8:
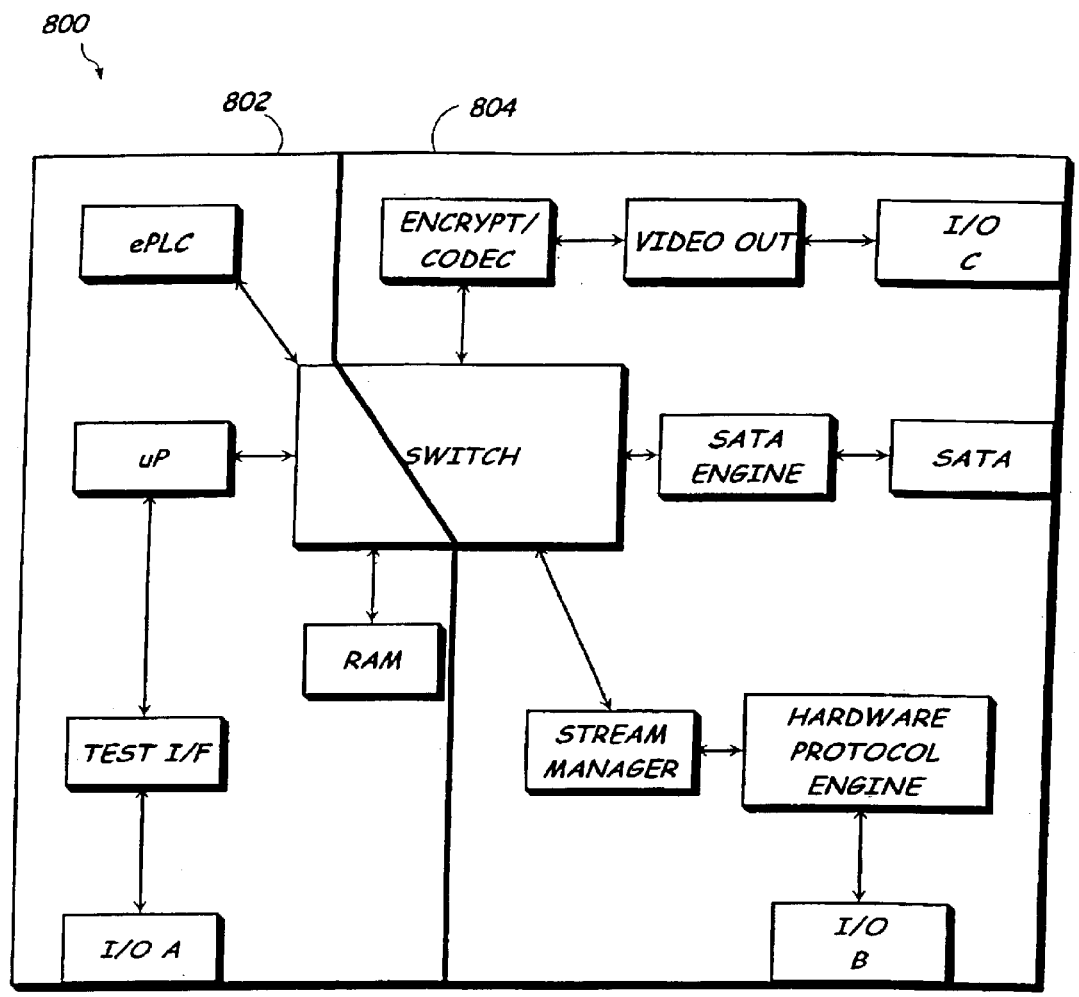
FIG. 8 is an illustration of an embodiment of the present invention in which logical partitioning is provided as determined by an agent.
Figure 9:
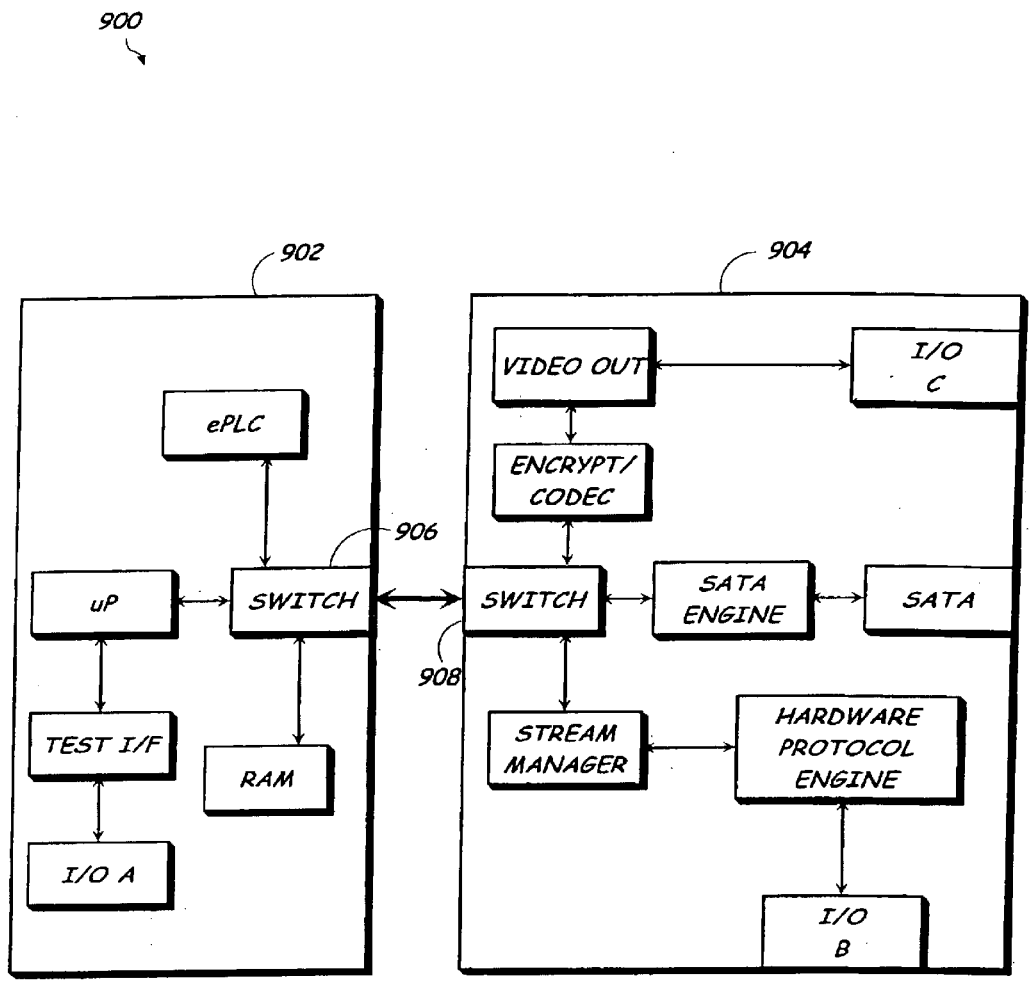
FIG. 9 is an illustration of an embodiment of the present invention wherein an provides physical portioning of an ASIC of the present invention.

Additionally, logical partitioning may be provided, as shown in the embodiment 800 depicted in FIG. 8, in which a first logical partition 802 and a second logical partition 804 are provided. Further, physical partitioning may be provided, such that components are provided on a first ASIC 902 and a second ASIC 904 with switches 906 & 908 to provide connectivity between the ASICs 902 & 904.

Further, the present invention may be utilized for programming a self-programmable device, by utilizing an abstract language that defines interconnections and block functional behavior as described previously. For instance, communication between components, such as cores, blocks, cells and the like as described previously, may be described in a hardware description language (HDL) format. A hardware description language, such as Verilog and VHDL, may be used to describe functions of an electronic circuit for documentation, simulation, logic synthesis, and the like. Thus, components may be specified and non-component specific behavior, such as interconnections and positioning, may be defined and converted to a HDL format for loading onto a FPGA/PLD/DPLD, SPLD, and the like via an I/O port. In this way, a design process may be provided in which a modular design is employed to provide ASIC design, and may further utilize a compiler to optimize the resultant code.

Figure 10:
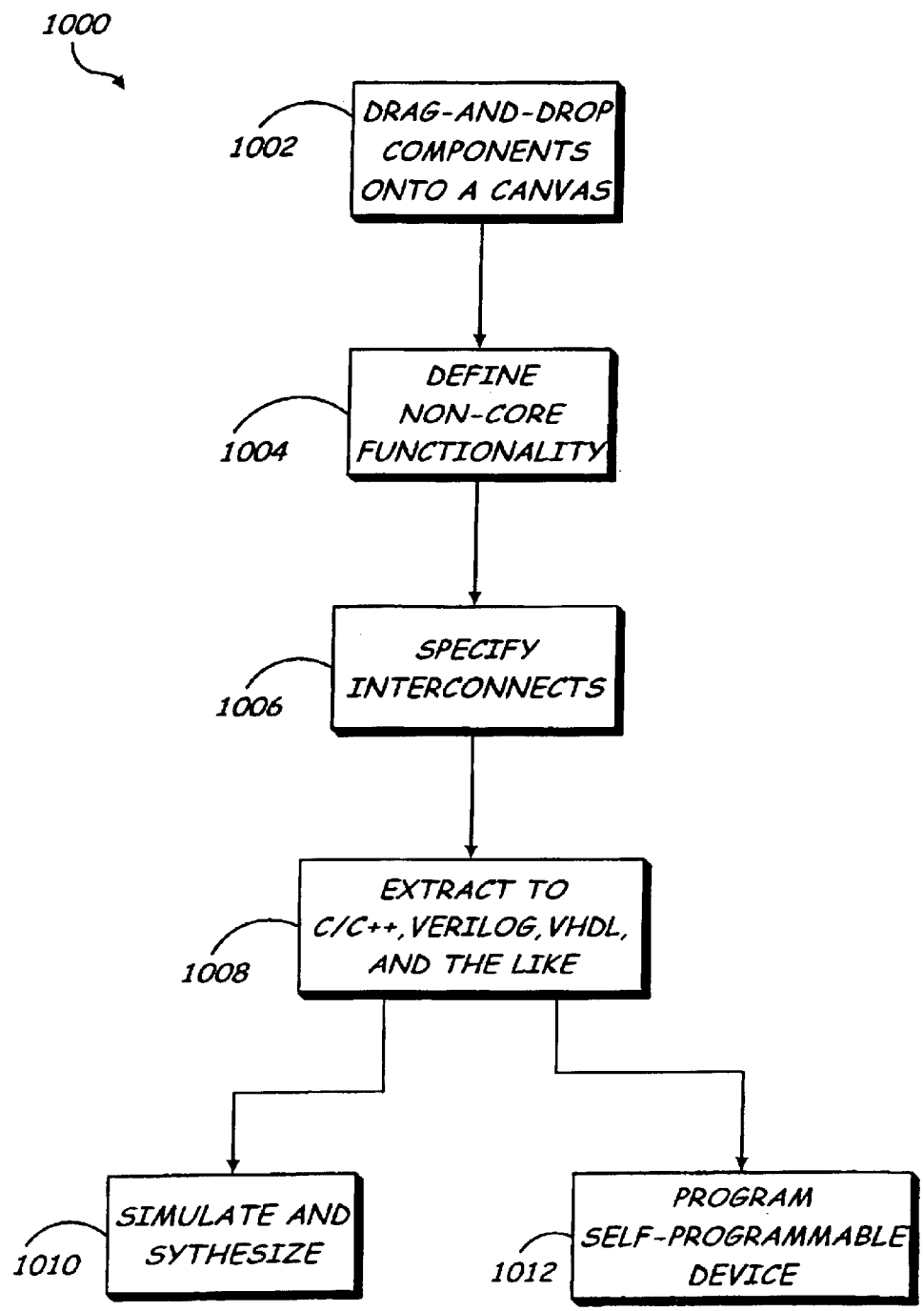
FIG. 10 is a flow diagram depicting an exemplary method of the present invention wherein a design process suitable for providing an ASIC and for programming a self-programmable device is shown.

For example, referring now to FIG. 10, an exemplary method 1000 of the present invention is shown wherein a design process is suitable for providing an ASIC and for programming a self-programmable device. Components are "dragged-and-dropped" onto a canvas from a template including representations of the desired components 1002, as shown in FIG. 3. Non-core functionality is then defined 1004, such as latency, desired positioning of selected components, and the like. Next, interconnects are specified 1006, which may include desired bandwidth between components, as shown in FIG. 4.

The non-core functionality, specified interconnects, bandwidth, and the like are then extracted 1008 to a hardware description language format, which may be formatted in C/C++, Verilog, VHDL, and the like. The language may then be utilized both to simulate and synthesize an ASIC 1010, program a self-programmable device 1012, and the like, as contemplated by a person of ordinary skill in the art, without departing from the spirit and scope of the present invention.

Figure 11:
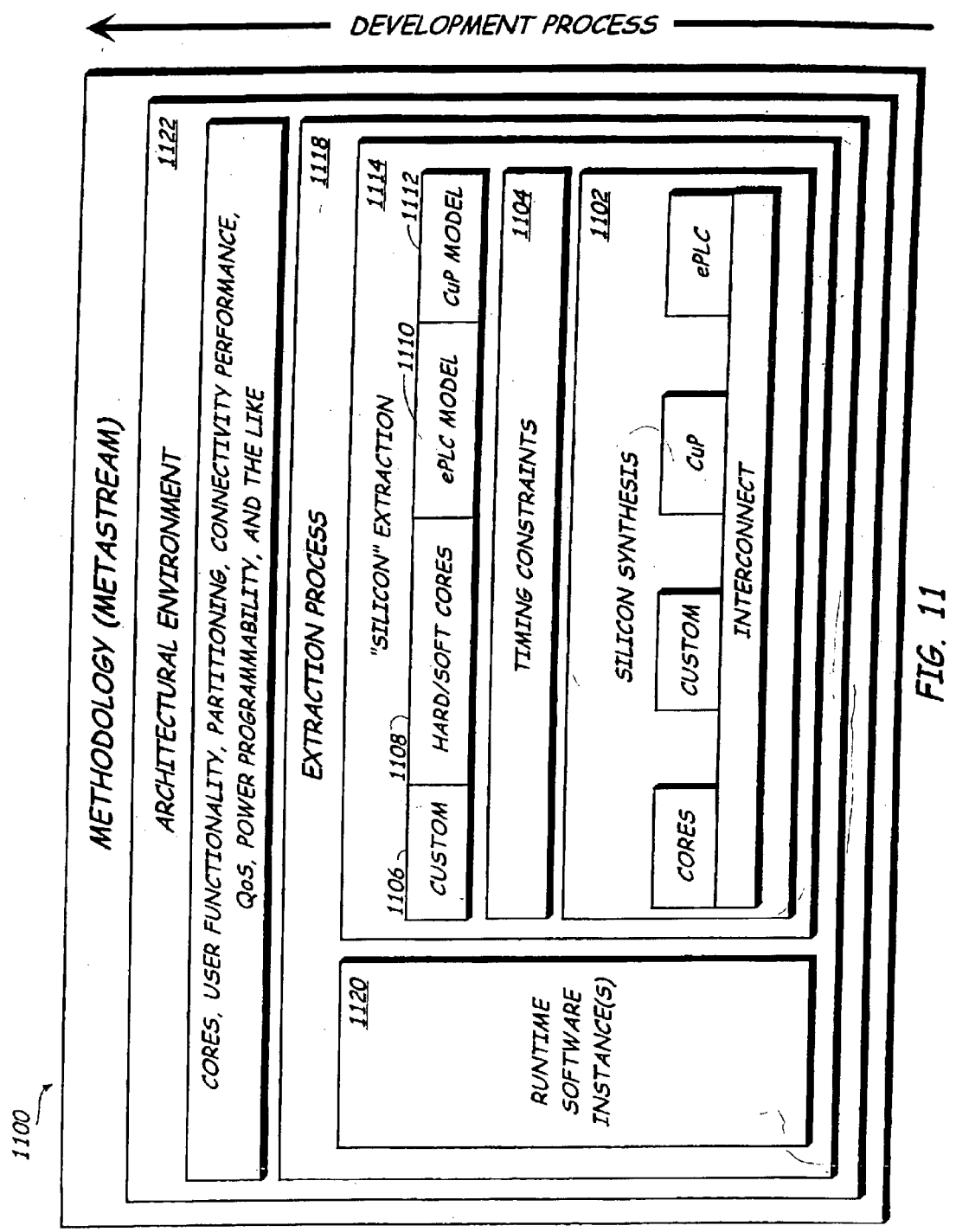
FIG. 11 is an illustration of an exemplary embodiment of the present invention wherein a system approach for designing an ASIC is shown.

Referring now to FIG. 11, a system approach employing the present invention is shown. The present invention may be incorporated into a system 100 for employing the development process described so as to provide a systematic and efficient chip design. The system may include a variety of layers and abstractions for performance of the design process.

For instance, a canvas with functional blocks may be provided for manipulation by a user for selecting components of an ASIC, defining an interconnect definition, and arriving at as shown in FIGS. 2 through 5, to perform "silicon synthesis" stage 1102 of the development process. Timing constraints 1104, as well as other steps, such as employing custom models 1106, hard/soft cores 1108, ePLC models 1110, CuP model 1112, and the like, are used to perform the "silicon" extraction 1114 step. The extraction process 1118 may then be completed through implementing runtime software instances 1120 in order to verify the extraction process.

The extraction process 1118 is included within an architectural environment 1122 which provides cores, user functionality, partitioning, connectivity performance, quality of service, power programmability, and the like as contemplated by a person of ordinary skill in the art. Thus, the architectural environment 1122 may implement the actual architecture design and verification of an ASIC in relation to the desired factors in the ASIC design as specified and/or desired by an end user. Additionally, the Architectural environment 1122 may be incorporated with a metastream methodology.

Further, the process may also provide design optimizations based on cost. For example, a user may design an ASIC in which a plurality of functional blocks are described. However, it may be more efficient to partition the ASIC into two separate packages that are smaller, to enable a smaller dye to be utilized, and thus, more cost effective. Other such design optimization may be employed by the present invention, such as through an agent, such as a design compiler, without departing from the spirit and scope of the present invention.

By providing an abstract language to define chip design and operation, a self-programming device concept may be implemented to provide optimization to the chip. For example, the language and methodology described above used to describe interrelationships of chip components may also be utilized to optimize an integrated circuit, and further such optimization may be achieved by the chip itself, such as in a self-programming device.

One way of achieving optimization may be realized through the use of isochronous communication. Isochronous communication, as previously described, may enable communication through a defined begin and end of a data stream, a single end of a data stream, and the like. Such a form of communication may further enable optimization of a chip based on data type. For example, although faster data transmission is desirable, certain data types may not lend themselves to such improved transmission, such as streaming data for output, like voice, video, and the like. Therefore, transmission of data within the chip may be optimized to take into account the various data types by implementing routing procedures and interconnects that take into account desired data transmission characteristics.

For instance, a start-up cycle may be initiated between two functional components to begin isochronous communication, and handshaking performed to arrive at a desired connection characteristics. Packeted data may then be sent between the components. Sending packets does not have to be periodic within the data transfer cycle, because through the use of isochronous communication, the data is routed until the end of the data transfer cycle is indicated. Thus, optimal routing paths and data transfer methodologies may be employed to arrive at an optimum performance level.

Further, transmission may be optimized based on the performance of the included components, such as availability of processing cycles, storage reads/writes, and the like as contemplated by a person of ordinary skill in the art. For instance, an electronic data storage device may be able to perform a given amount of writes in a period of time, and therefore by scheduling data transmitted to the data storage device based on availability, both the storage device and the transfer of the data itself may be optimized.

One method of scheduling contemplated by the present invention involves the use of the interconnect and/or a processor included within the chip to provide the desired performance characteristics. Through the use of the interconnect, packets may be scheduled based on priority and available resources, such as through the use of functional blocks as indicated by the number of packets sent, size of packets sent, and the like.

Thus, an agent may be provided for operation in conjunction with the processor to schedule transfer of data For example, attributes as well as data packages may be implemented through the use of an intelligent switch/router to determine priority of data, determine a correct channel, such as a channel with low congestion to perform a desired function immediately, such as the transfer of streaming data. The agent may describe the desired interconnections and configuration of the chip and have such information included on the chip. For example, an integrated circuit (IC) of the present invention may include RAM including a program of instructions being suitable for describing interconnections, hierarchy of data packets for transfer between components, and the like. The program of instructions may be updated by the agent based on monitored behavior, to achieve self-programmable optimization.

In this way, an interconnect of the present invention may be provided that provides close timing between components, independent of other components so as to provide any specialized transfer functionality needed, such as timing and the like. Additionally, the interconnect have the ability to scale, ability to act as a switch base, and as a packet phase. Further, transfer of data may be achieved similar to a memory base, so that data is transferred to a desired space in a memory address. Handshaking may also be provided within the interconnect in order to create an optimized transfer contract between components.

Optimization of the chip may also be based on heuristic knowledge. For example, through monitoring and experience in the utilization of chips, knowledge may be derived pertaining to how the components interact. Thus, the design may be optimized for this interaction. For example, if two functional components were provided, and during operation, the bandwidth required between the components was a target amount, that amount may be provided in subsequent designs involving those components. Likewise, communication between additional components may be examined and utilized in the provision of layout, design and bandwidth provided on a chip.

Through the derivation and storage of this experience in a design system of the present invention, such as through the use of firm and soft macros, this knowledge may be utilized to provide optimized chips in a desired configuration without needless duplicative testing and design procedures which were already encountered and addressed in previous designs, in essence, the system would not have to "recreate the wheel" each time.

Additionally, an agent may be utilized to configure the chip based on heuristics. Through the use of the abstraction language in which interconnections and non-functional component behavior is described between components, the chip itself may achieve optimization through the monitoring of on-chip behavior, such as data transfer and the like. For instance, previously determined routes and interconnections may be optimized by monitoring the past behavior, and then allocating system resources and routing based on that behavior, such as an interconnection between components may be monitored in which the interconnection does not utilize the total available connection based on the route, but another interconnection does not have sufficient resources. Therefore, the interconnections and resource may be optimized so that optimum performance is achieved by providing the necessary bandwidth between components.

Thus, an interscalable interconnect maybe provided that is scalable and isochronous capable. Additionally, an abstract language may be provided to be able to describe interconnecting core functions. Further, a self-programmable chip may be provided that, upon receiving a construct, it could program itself to achieve the desired functionality, such as through the use of on-chip knowledge and the like. Although a discussion of a "chip" was made, multiple chip solutions are specifically contemplated by the present invention without departing from the spirit and scope thereof.

It is believed that the system and method for designing an integrated circuit of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for designing an integrated circuit, comprising:
   manipulating representations of components of an integrated circuit on a display device by a user;
   specifying an interconnect having at least one of a communication characteristic and a performance characteristic between a first represented component and a second represented component; and
   extracting data suitable for describing the specified interconnect between the first represented component and the second represented component;
   wherein the extracted data includes a direct connectivity definition.

2. A method for designing an integrated circuit, comprising:
   manipulating representations of components of an integrated circuit on a display device by a user;
   specifying an interconnect having a characteristic between a first represented component and a second represented component; and
   extracting data suitable for describing the specified interconnect between the first represented component and the second represented component;
   wherein the specified characteristic includes at least one of bandwidth, latency and scalability.

3. A method for designing an integrated circuit, comprising:
   manipulating representations of components of an integrated circuit on a display device by a user;
   specifying an interconnect having a characteristic between a first represented component and a second represented component;
   extracting data suitable for describing the specified interconnect between the first represented component and the second represented component; and
   optimizing at least one of the components and interconnects;
   wherein optimizing includes at least one of arranging components of the integrated circuit and specifying bandwidth between components.

4. The method as described in claim 3, wherein components are arranged based on latency, scalability, timing considerations, power considerations, data switching and bandwidth.

5. A method for designing an integrated circuit, comprising:
   manipulating representations of components of an integrated circuit on a display device by a user;
   specifying an interconnect having a characteristic between a first represented component and a second represented component;
   extracting data suitable for describing the specified interconnect between the first represented component and the second represented component; and
   optimizing at least one of the components and interconnects;
   wherein optimizing is performed without user intervention by an agent.

6. A method for designing an integrated circuit, comprising:
   manipulating representations of components of an integrated circuit on a display device by a user;
   specifying an interconnect having a characteristic between a first represented component and a second represented component; and
   extracting data suitable for describing the specified interconnect between the first represented component and the second represented component;
   wherein components include standardized interfaces.

7. The method as described in claim 6, wherein the standardized interfaces communicate over interscalable, isochronous interconnect glue logic.

8. A method for designing an integrated circuit, comprising:
   manipulating representations of components of an integrated circuit on a display device by a user;
   specifying an interconnect having a characteristic between a first represented component and a second represented component; and
   extracting data suitable for describing the specified interconnect between the first represented component and the second represented component;
   wherein interconnects not specified by a user are automatically configured by an agent.

9. A system for designing an integrated circuit, comprising:
   a display device, the display device suitable for displaying representations of components of an integrated circuit for manipulation by a user;
   a memory suitable for storing a program of instructions; and
   a processor suitable for performing the program of instructions, the processor communicatively coupled to the display device and the memory, wherein the program of instructions configures the processor to
      display representations of components of an integrated circuit for manipulation by a user on the display device so that a user, will specify an interconnect having a characteristic between a first component representation and a second component representation, and
      extract data describing the first represented component, the second represented component and the specified interconnect as manipulated by the user;
   wherein the specified characteristic includes at least one of bandwidth, scalability and latency.

10. The system as described in claim 9, wherein the scalability specified includes at least one of number of links and speed of links.

11. A system for designing an integrated circuit, comprising:
   a display device, the display device suitable for displaying representations of components of an integrated circuit for manipulation by a user;
   a memory suitable for storing a program of instructions; and
   a processor suitable for performing the program of instructions, the processor communicatively coupled to the display device and the memory, wherein the program of instructions configures the processor to
      display representations of components of an integrated circuit for manipulation by a user on the display device so that a user will specify an interconnect having a characteristic between a first component representation and a second component representation, and
      extract data describing the first represented component, the second represented component and the specified interconnect as manipulated by the user;
   wherein interconnects not specified by a user are automatically configured by an agent.

12. A system for designing an integrated circuit, comprising:
   a display device, the display device suitable for displaying representations of components of an integrated circuit for manipulation by a user;
   a memory suitable for storing a program of instructions;
   a processor suitable for performing the program of instructions, the processor communicatively coupled to the display device and the memory, wherein the program of instructions configures the processor to
      display representations of components of an integrated circuit for manipulation by a user on the display device so that a user will specify an interconnect having a characteristic between a first component representation and a second component representation; and
      extract data describing the first represented component, the second represented component and the specified interconnect as manipulated by the user; and
   an integrated circuit communicatively coupled to the processor, wherein the integrated circuit receives the extracted data, wherein the extracted data is utilized by the integrated circuit for being programmed to include the interconnect having the characteristic between a first component corresponding to the first component representation and a second component corresponding to the second component representation;
   wherein the specified characteristic includes at least one of bandwidth, latency and scalability.

13. The system as described in claim 12, wherein the scalability specified includes at least one of number of links and speed of links.

14. A system for designing an integrated circuit, comprising:
   a display device, the display device suitable for displaying representations of components of an integrated circuit for manipulation by a user;
   a memory suitable for storing a program of instructions;
   a processor suitable for performing the program of instructions, the processor communicatively coupled to the display device and the memory, wherein the program of instructions configures the processor to
      display representations of components of an integrated circuit for manipulation by a user on the display device so that a user will specify an interconnect having a characteristic between a first component representation and a second component representation; and
      extract data describing the first represented component, the second represented component and the specified interconnect as manipulated by the user; and
   an integrated circuit communicatively coupled to the processor, wherein the integrated circuit receives the extracted data, wherein the extracted data is utilized by the integrated circuit for being programmed to include the interconnect having the characteristic between a first component corresponding to the first component representation and a second component corresponding to the second component representation;
   wherein interconnects not specified by a user are automatically configured by an agent.

15. An application specific integrated circuit, comprising:
   a first component suitable for providing an integrated circuit function, the first component communicatively coupled to a first interface device;
   a second component suitable for providing an integrated circuit function, the second component communicatively coupled to a second interface device;

an interconnect suitable for communicatively coupling the first interface device with the second interface device so as to enable communication of the first component with the second component;

a memory suitable for storing a program of instructions, the program of instructions including data received for configuring an interconnect having a characteristic between components of an application specific integrated circuit; and a microprocessor suitable for performing the program of instructions, the microprocessor communicatively coupled to the memory, wherein the program of instructions configures the microprocessor to configure the first component, the second component, and the interconnect to correspond to an interconnect having the characteristic as indicated by the program of instructions;

wherein the interconnect is interscalable.

16. An application specific integrated circuit, comprising:

a first component suitable for providing an integrated circuit function, the first component communicatively coupled to a first interface device;

a second component suitable for providing an integrated circuit function, the second component communicatively coupled to a second interface device;

an interconnect suitable for communicatively coupling the first interface device with the second interface device so as to enable communication of the first component with the second component;

a memory suitable for storing a program of instructions, the program of instructions including data received for configuring an interconnect having a characteristic between components of an application specific integrated circuit; and a microprocessor suitable for performing the program of instructions, the microprocessor communicatively coupled to the memory, wherein the program of instructions configures the microprocessor to configure the first component, the second component, and the interconnect to correspond to an interconnect having the characteristic as indicated by the program of instructions;

wherein the microprocessor is suitable for self-programming to enable optimization of the ASIC, and wherein optimization includes routing of packeted data.

17. An application specific integrated circuit, comprising:

a first component suitable for providing an integrated circuit function, the first component communicatively coupled to a first interface device;

a second component suitable for providing an integrated circuit function, the second component communicatively coupled to a second interface device;

an interconnect suitable for communicatively coupling the first interface device with the second interface device so as to enable communication of the first component with the second component;

a memory suitable for storing a program of instructions, the program of instructions including data received for configuring an interconnect having a characteristic between components of an application specific integrated circuit; and a microprocessor suitable for performing the program of instructions, the microprocessor communicatively coupled to the memory, wherein the program of instructions configures the microprocessor to configure the first component, the second component, and the interconnect to correspond to an interconnect having the characteristic as indicated by the program of instructions;

wherein packeted data is routed based on at least one of an indicated priority of data, component resource availability, priority of data when compared through use of heuristic data and data characteristic.

18. The application specific integrated circuit as described in claim 17, wherein the data characteristic includes streaming data and electronic storage device data.

19. The application specific integrated circuit as described in claim 17, wherein component resource availability is determined by at least one of an amount of data previously transferred to a component, amount of data received from the component, characteristic of data sent to the component and characteristic of data received from the component.

* * * * *